United States Patent [19]
Kasahara et al.

[11] Patent Number: 5,945,688
[45] Date of Patent: Aug. 31, 1999

[54] OPTICAL SEMICONDUCTOR DEVICE AND LEAD FRAME USED IN SUCH A DEVICE

[75] Inventors: Masataka Kasahara; Kenichi Sakaguchi, both of Nagano, Japan

[73] Assignee: Shinko Electric Industries Co., Ltd., Nagano, Japan

[21] Appl. No.: 09/085,361

[22] Filed: May 27, 1998

[30] Foreign Application Priority Data

May 29, 1997 [JP] Japan .................................. 9-157850

[51] Int. Cl.⁶ .......................... H01L 27/15; H01L 31/12; H01L 33/00; H01L 23/495
[52] U.S. Cl. .............................. 257/81; 257/84; 257/666; 257/676
[58] Field of Search .............................. 257/79, 81, 666, 257/668, 676, 84; 385/14, 99

[56] References Cited

U.S. PATENT DOCUMENTS

| | | | |
|---|---|---|---|
| 5,011,256 | 4/1991 | Johnson et al. | 350/96.2 |
| 5,170,453 | 12/1992 | Go et al. | 385/70 |
| 5,353,364 | 10/1994 | Kurashima | 385/88 |
| 5,611,006 | 3/1997 | Tabuchi | 385/14 |
| 5,633,971 | 5/1997 | Kurashima | 385/78 |
| 5,671,315 | 9/1997 | Tabuchi et al. | 385/137 |

FOREIGN PATENT DOCUMENTS 08166523  6/1996  Japan .

*Primary Examiner*—Mahshid Saadat
*Assistant Examiner*—Jesse A. Fenty
*Attorney, Agent, or Firm*—Pennie & Edmonds LLP

[57] ABSTRACT

A lead frame for mounting thereon an optical semiconductor device includes a stage, a plurality of leads arranged in a peripheral region of the stage and a support member extended from said stage. An optical semiconductor device includes such a lead frame, a substrate mounted on the stage of the lead frame, an optical semiconductor chip mounted on the substrate and having electrodes which are electrically connected to the electrodes. An optical fiber has a leading end which is mounted on the substrate and an intermediate portion which is fixedly secured to the support member so that the leading end portion is located at a predetermined position with respect to the chip. An insulating sealing material hermetically seals the optical semiconductor chip, the leading end portion of the optical fiber and at least a part of the support member.

12 Claims, 5 Drawing Sheets

OPTICAL SEMICONDUCTOR DEVICE AND LEAD FRAME USED IN SUCH A DEVICE

BACKGROUND OF THE INVENTION

1. Field of the Invention

The present invention relates to a lead frame for mounting thereon an optical semiconductor device in which an optical semiconductor chip is hermetically sealed and also relates to an optical semiconductor device using such a lead frame.

2. Description of the Related Art

An optical semiconductor device known in the prior art has such a structure that a silicon substrate, on which an optical semiconductor chip and a leading end of an optical fiber are fixedly mounted, is accommodated in a ceramic package (a package made from a ceramic material) or a metal package (a package made from a metal).

Although such a ceramic package and a metal package are advantageous in their sealing properties, they are expensive and not suitable for commonly used optical semiconductor devices.

In order to solve these problems, a hermetically sealed type optical semiconductor device has been proposed in which an optical semiconductor chip, such as LD (laser diode), PD (photo diode) or similar elements and a leading end of an optical fiber for, for example, emitting a light to the optical semiconductor chip are fixedly mounted on a lead frame and hermetically sealed with any suitable sealing material, such as molding resin, together with a part of the lead frame.

However, in such a hermetically sealed type optical semiconductor device, when the substrate, on which the optical semiconductor chip and the leading end of the optical fiber are fixedly mounted, is sealed with the molding material by a transfer molding process or an injection molding process, a relatively weak intermediate portion of the optical fiber, made of such as a silica glass and located outside of the substrate, may be pressed by the sealing material. Therefore, that portion may be deformed and a crack may be generated and, in some cases, a disconnection of the fiber may occur. In this case, the intermediate portion of the optical fiber can no longer effectively transmit the light.

SUMMARY OF THE INVENTION

An object of the present invention is to provide an optical semiconductor lead frame for mounting thereon an optical semiconductor device (hereinafter simply referred to a "lead frame") and an optical semiconductor device using such a lead frame in which an intermediate portion of the optical fiber located outside of the substrate and sealed with a sealing material, such as a molding resin, may not be deformed and prevented from generating cracks and becoming disconnected.

According to the present invention, there is provided a lead frame for mounting thereon an optical semiconductor device, the lead frame comprising: a stage on which a substrate is to be mounted, the substrate being used for mounting thereon an optical semiconductor chip and a leading end of an optical fiber; a plurality of leads arranged in a peripheral region of the stage; and a support member extended from the stage, the support member being used for fixedly positioning an intermediate portion of the optical fiber with respect to the stage.

The stage and the support member are integrally made of a metal plate.

The support member has a bottom portion and a pair of upright walls extending upward from respective sides of the bottom portion. The upright walls have vertical slits or gaps to form comb-shaped walls.

The support member is made of plastically deformable material so that the pair of upright walls of the support member can be bent inward with respect to each other to encircle the intermediate portion of the optical fiber and fixedly secure the same.

The support member has a substantially U-shaped groove so that the intermediate portion of the optical fiber can be inserted into the substantially U-shaped groove and fixedly positioned with respect to the stage. Otherwise, the support member has a substantially V-shaped groove so that the intermediate portion of the optical fiber can be inserted into the substantially U-shaped groove and fixedly positioned with respect to the stage.

According to another aspect of the present invention, there is provided an optical semiconductor device comprising: a lead frame comprising a stage, a plurality of leads arranged in a peripheral region of the stage and a support member extended from the stage; a substrate mounted on the stage of the lead frame; an optical semiconductor chip mounted on the substrate and having a plurality of electrodes; means for electrically connecting the electrodes to the leads; an optical fiber having a leading end portion which is mounted on the substrate and an intermediate portion which is fixedly secured to the support member so that the leading end portion is located at a predetermined position with respect to the optical semiconductor chip; and insulating sealing means for hermetically sealing the optical semiconductor chip, the leading end portion of the optical fiber and at least a part of the support member.

The intermediate portion of the optical fiber is located at an outside of the substrate.

The intermediate portion of the optical fiber is fixedly secured to the support member by means of adhesive. Otherwise, the support member is made of plastically deformable material and has a bottom portion and a pair of upright walls extending upward from respective sides of the bottom portion, and the pair of upright walls of the support member are bent inward with respect to each other to encircle the intermediate portion of the optical fiber so that the intermediate portion is fixedly secured to the support member.

The insulating sealing means is a mold resin.

DETAILED DESCRIPTION OF THE EMBODIMENTS

Figure 1:
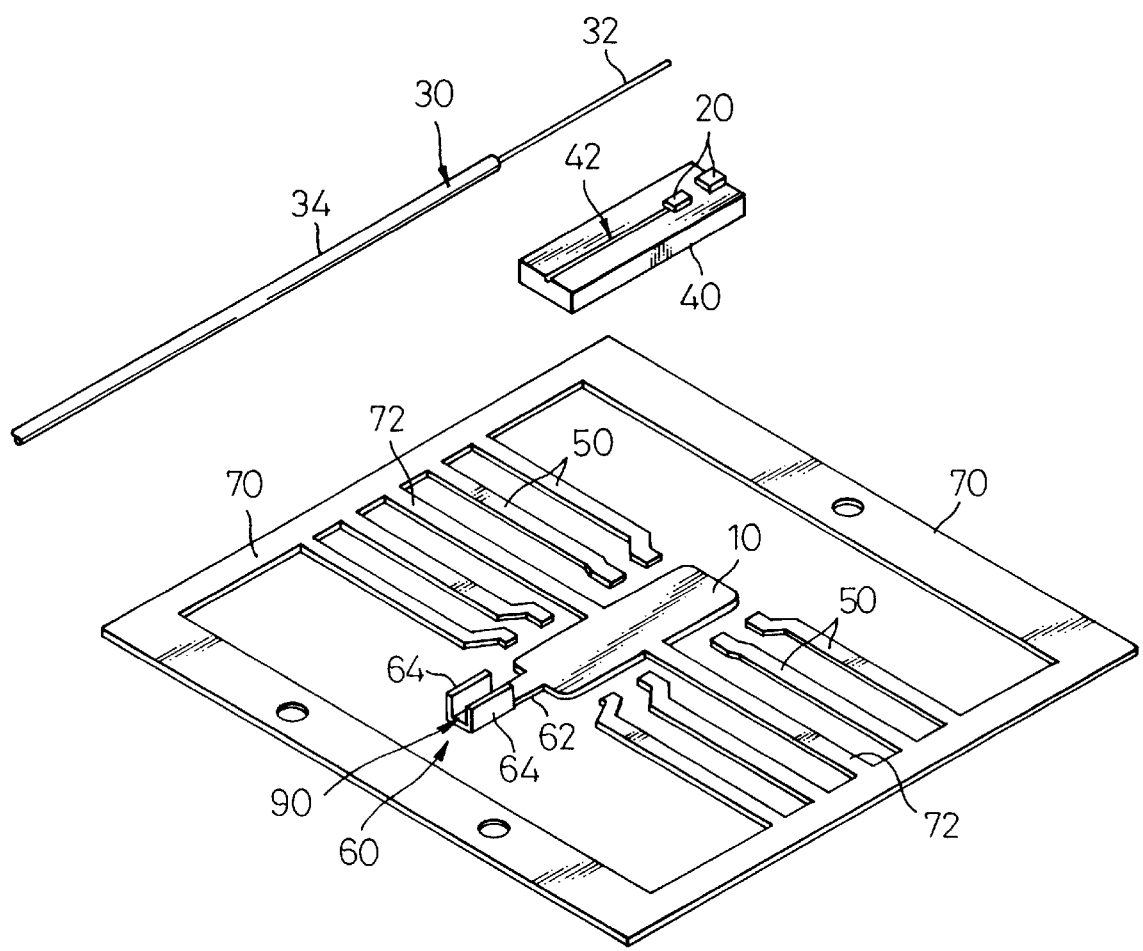
FIG. 1 is a perspective view of a lead frame of this invention.

Referring now to the drawings, wherein a preferred embodiment of a lead frame of this invention is shown in a perspective view in FIG. 1. This lead frame will be described in detail below.

As shown in FIG. 1, the lead frame comprises a stage 10 on which a substrate 40 is mounted. On the substrate 40 fixedly mounted are optical semiconductor chips 20 and a leading end of an optical fiber 30. The stage is made of a high heat conductive material, such as Cu.

At the respective left and right sides of the stage 40 there are a plurality of thin strip-like leads 50 laterally arranged at predetermined intervals. These leads 50 are formed in such a manner that electrodes of the optical semiconductor chips 20 mounted on the substrates 40 on the stage 10 can be electrically connected to the leads 50 by means of wires. The leads 50 are also made of a high heat conductive material, such as Cu. Inner end portions of the leads 50 to which the electrodes of the optical semiconductor chips 20 are electrically connected are plated with Au so that the inner end portions of the leads 50 can efficiently and stably connected to the wires for electrically connecting the optical semiconductor chips 20.

A supporting member 60 extends from a front end of the stage 10 which is used for positioning an intermediate portion 34 of an optical fiber 30 which is located in the outside of the substrate 40 with respect to the stage 10.

As shown in FIG. 1, the supporting member 60 comprises a strip-like flat portion 62 extended from the front end of the stage 10 and a pair of side walls 64 extended upward from the respective sides of the flat portion 62 to define a guide groove 90 having U-shaped or similar cross-section. Therefore, the intermediate portion 34 of the optical fiber 30 can be inserted into this guide groove 90 to position the intermediate portion 34 at a predetermined location with respect to the stage 10. The supporting member 60 is made of plastically deformable material, such as Cu, so that the pair of side walls 64 upstanding at the respective left and right sides thereof may easily be bent inward along the periphery of the intermediate portion 34 of the optical fiber 30 to stably fix the same in the guide groove 90.

Around the peripheral area of the stage 10 and the plurality of leads 50 there is a rectangular frame shaped, flat strip-like guide rail 70 by which outer ends of the respective leads 50 are supported. The stage 10 is also supported by the guide rail 70 by means of support bars 72. The stage 10, leads 50, support member 60, guide rails 70 and support bars 72 can also be made by a single metal strip, such as Cu.

The lead frame is constructed as mentioned above. An example of the usage of such a lead frame will now be described in detail with reference to an optical semiconductor device.

Figure 2:
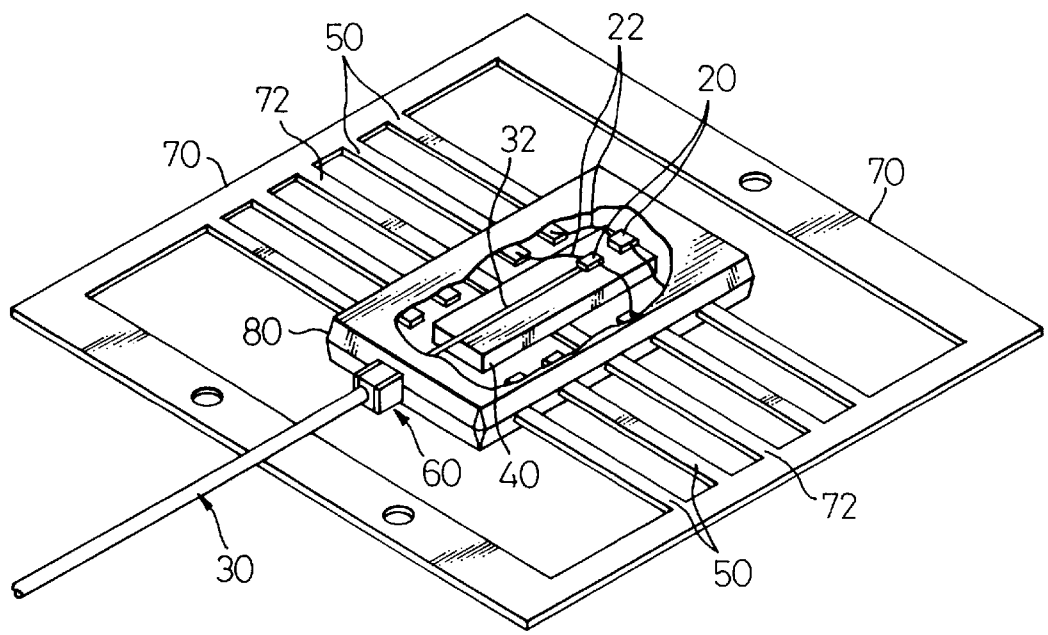
FIG. 2 is a perspective view of an optical semiconductor device of this invention which is partially broken to look the inside of the device.
Figure 3:
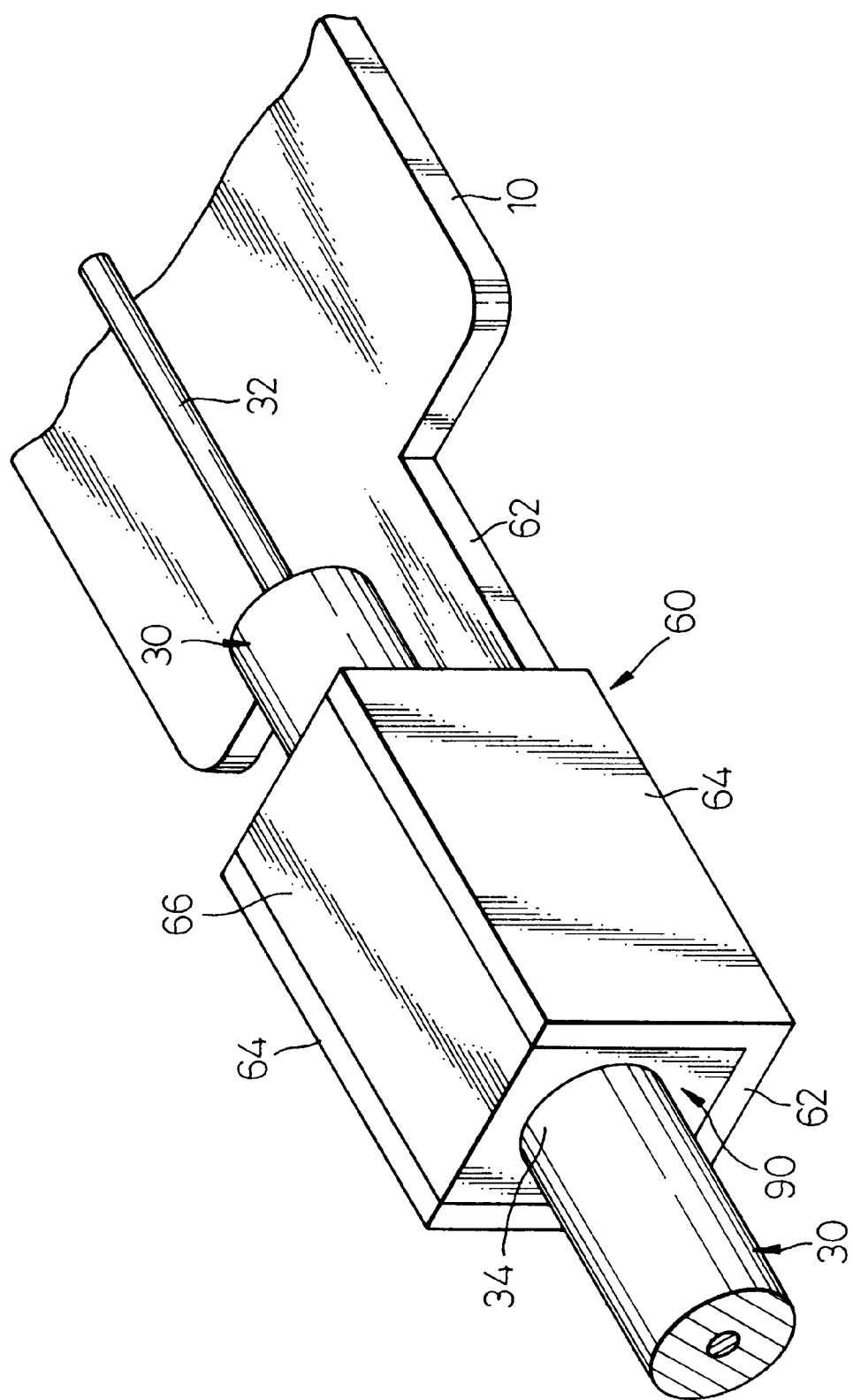
FIG. 3 is an enlarged perspective view of a support ember and its peripheral members used in the optical semiconductor device of this invention.
Figure 4:
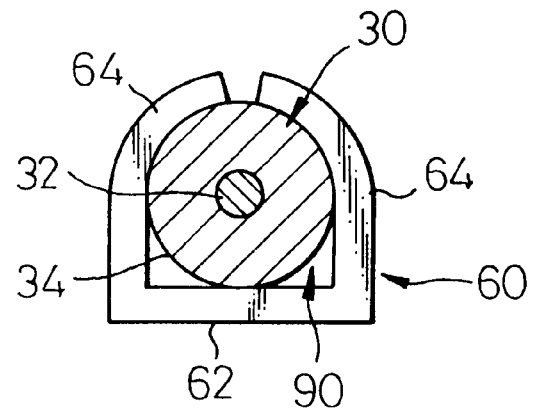
FIG. 4 is an enlarged view of the embodiment of we support member and the optical fiber.

A preferred embodiment of the optical semiconductor device is shown in FIGS. 2, 3 and 4, in which FIG. 2 is a perspective view of the optical semiconductor device, FIGS. 3 and 4 are enlarged perspective views of supporting means and its peripheral members used in the optical semiconductor device.

In the optical semiconductor device shown in these drawings, two optical semiconductor chips 20, i.e., an LD (laser diode) and a PD (photo diode), and a leading end of the optical fiber 30 are fixedly attached on the substrate 40.

In particular, as shown in FIGS. 1 and 2, the substrate 40 made of silicon or the similar material is provided on an upper surface thereof with a V-shaped groove 42 extending in the longitudinal direction. The leading end of the optical fiber 30, i.e., the core portion 32 of the optical fiber 30 which is exposed, is inserted in this V-shaped groove 42. Thus, the leading end of the optical fiber 30 is positioned and fixed along the V-shaped groove 42.

In front of the V-shaped groove 42, the substrate 40 is provided on an upper surface thereof with a chip mount area on which the optical semiconductor chips 20, such as an LD and a PD, are mounted. The chip mount area has a positioning mark (not shown) along which the optical semiconductor chips 20, such as an LD for emitting a laser beam and a PD for monitoring the output from the chip, are fixedly mounted. Thus, a laser beam emitted from the optical semiconductor chip 20, such as an LD, is transmitted to the leading end of the optical fiber 30, or the laser beam emitted from LD is monitored by the optical semiconductor chip 20, such as a PD.

The spaces between the leading end of the optical fiber 30 and the beam emitting optical semiconductor chip 20, such as an LD, and between LD and the chip monitoring optical semiconductor chip 20, such as a PD, are filled with an agent (not shown) for regulating refractive index by a potting process. Thus, these spaces are protected by such an agent so as not to be prevented the light transmission due to the entrance into these spaces with a light impermeable sealing material which will be described later in detail.

The substrate 40 is fixedly mounted on the stage 10 of the lead frame as mentioned above with reference to FIG. 1. The electrodes of the optical semiconductor chips 20 are electrically connected to the inner end portions of the leads 50, arranged around the stage 10 and in the vicinity of the optical semiconductor chips 20, by means of connecting means 22, such as bonding wires.

The intermediate portion 34 of the optical fiber 30 located outside of the substrate 40 is inserted into the U-shaped guide groove 90 of the supporting member 60 and positioned a predetermined location with respect to the stage 10 and thus the intermediate portion 34 of the optical fiber 30 is fixed at that position.

In particular, the intermediate portion 34 of the optical fiber 30 may be attached and fixed to the supporting member 60 by means of an adhesive 66 in one embodiment, as shown in FIG. 3.

In the same manner, as shown in FIG. 4, the intermediate portion 34 of the optical fiber 30 may be fixed by bending inward or plastically deforming the pair of side walls 64 upstanding at the respective left and right sides of the supporting member 60 so that the intermediate portion 34 of the optical fiber 30 is fixed along the periphery thereof in the U-shaped guide groove 90 of the supporting member 60.

The optical semiconductor chips 20 and the leading end portion of the optical fiber 30 are hermetically sealed together with an inner end portion of the supporting member 60 with a block-shaped insulating sealing means 80 of mold material, such as epoxy resin, thermoplastic resin or a similar material. Thus, the optical semiconductor chips 20, the leading end of the optical fiber 30 and the inner end portion of the supporting member 60, to which the intermediate portion of the optical fiber 30 is attached, are fixed and insulated with respect to each other.

Therefore, in the optical semiconductor device shown in FIGS. 2 to 4, as mentioned above, the intermediate portion 34 of the optical fiber 30 can be inserted into the guide groove 90 of the support member 60 having U-shaped or the similar cross-section and then can be positioned with respect to the stage 10. Then, the intermediate portion 34 of the optical fiber 30 can be fixedly attached to the support member 60.

Therefore, when the intermediate portion 34 of the optical fiber 30 is hermetically sealed together with the mold material 80, the supporting member 60 prevents the intermediate portion 34 from being pushed by the mold material 80. Thus, generation of cracks and disconnection of the optical fiber 30 can be avoided. Also the intermediate portion 34 can be prevented from coming out of the supporting member 60.

Since the leading end of the optical fiber 30 and the intermediate portion 34 of the optical fiber 30 are fixed with respect to each other by means of the sealing material 80, no excess external force is exerted therebetween them and, therefore, any disconnection of the optical fiber 30 can be avoided by the sealing material 80. Also, the optical semiconductor chips 20 and the leading end portion of the optical fiber 30 are prevented from attracting dust and moisture. Thus, deterioration of functions thereof is prevented by the sealing material 80.

Figure 5:
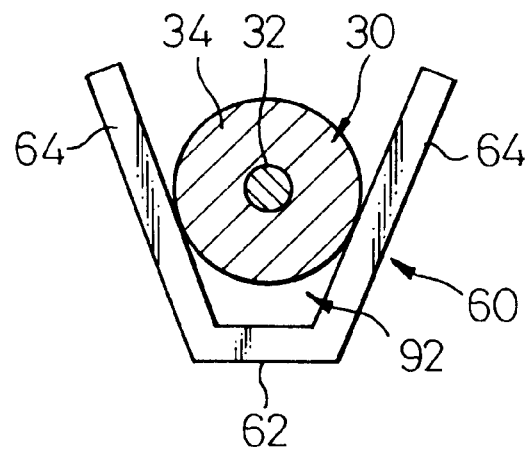
FIG. 5 is an enlarged view of another embodiment of the support member and the optical fiber.

In the lead frame and the optical semiconductor device in the above mentioned embodiment, the supporting member 60 may have a guide groove 92, having a substantially V-shaped or the similar cross-section, as shown in FIG. 5.

In the same manner as the previous embodiment, the intermediate portion 34 of the optical fiber 30, which is located outside of the substrate 40, can be inserted into the guide groove 92 of this support member 60 and then can be fixedly and accurately positioned with respect to the stage 10.

Figure 6:
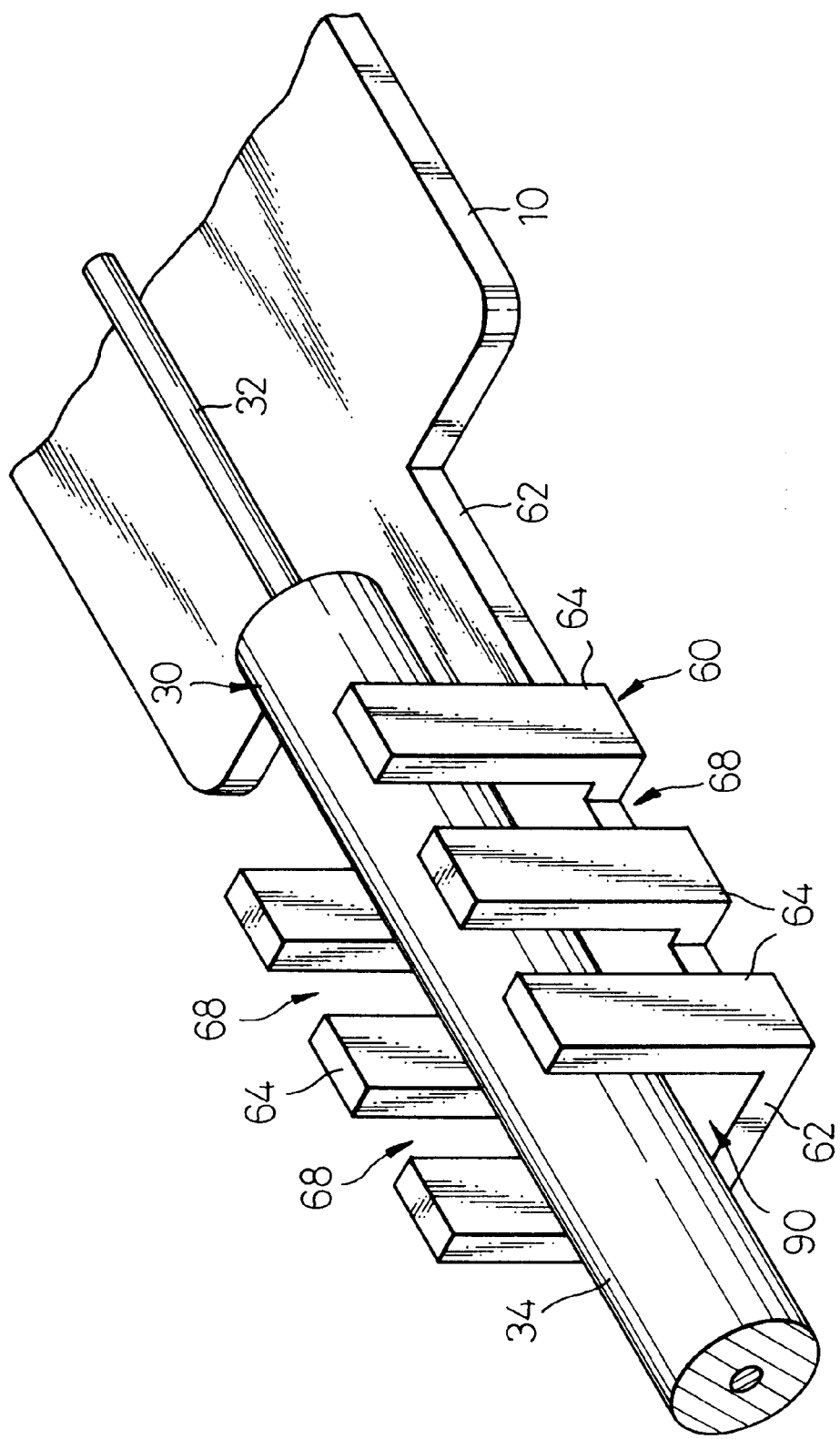
FIG. 6 is an enlarged perspective view of further embodiment of the support member and its peripheral members.

Also, as shown in FIG. 6, the respective upright walls 62 and 64 of the U-shaped or V-shaped support member 60 may have a plurality of the slits or gaps 68 to form comb-like walls. Thus, when the supporting member 60 is sealed with the sealing material 80, the sealing material may enter these slits or gaps 68 and thus the supporting member 60 can be more stably sealed and fixed.

The supporting member 60 can be made of a plastically undeformable material. In this case, the intermediate portion 34 of the optical fiber 30 inserted into the U-shaped guide groove 90 or V-shaped guide groove 92 of the support member 60 can be fixedly attached to the support member 60 by means of any appropriate adhesive 66 (FIG. 3).

The sealing material 80 may be a mold resin as mentioned above, or may be an insulating silicone resin. However, if a mold resin, which is widely used, is applied to this invention, the optical semiconductor chips 20 and the leading end portion of the optical fiber 30 are hermetically sealed together with an inner end portion of the supporting member 60 and can easily and accurately be sealed with such an insulating sealing means 80 by a transfer molding process or an injection molding process which are also conventionally and widely adopted in this technical art.

It should be understood by those skilled in the art that the foregoing description relates to only some preferred embodiments of the disclosed invention, and that various changes and modifications may be made to the invention without departing from the spirit and scope thereof.

We claim:

1. A lead frame for mounting thereon an optical semiconductor device, said lead frame comprising:

a stage on which a substrate is to be mounted, said substrate being used for mounting thereon an optical semiconductor chip and a leading end of an optical fiber;

a plurality of leads arranged in a peripheral region of said stage; and a support member extended from said stage, said support member being used for fixedly positioning an intermediate portion of the optical fiber with respect to said stage, wherein said support member has a bottom portion and a pair of upright walls extending upward from respective sides of said bottom portion and wherein said upright walls have vertical slits or gaps to form comb-shaped walls.

2. A lead frame as set forth in claim 1, wherein said stage and said support member are integrally made of a metal plate.

3. An optical semiconductor device comprising:

a lead frame comprising a stage, a plurality of leads arranged in a peripheral region of said stage and a support member extended from said stage;

said stage, said plurality of leads and said support member being formed on a common surface;

a substrate mounted on said stage of the lead frame;

an optical semiconductor chip mounted on said substrate and having a plurality of electrodes;

means for electrically connecting said electrodes to said leads;

an optical fiber having a leading end portion which is mounted on said substrate and an intermediate portion which is fixedly secured to said support member so that said optical fiber is guided along a flat surface of said support member and said leading end portion is located at a predetermined position with respect to said optical semiconductor chip; and insulating sealing means for hermetically sealing said optical semiconductor chip, said leading end portion of the optical fiber and at least a part of said support member.

4. An optical semiconductor device as set forth in claim 3, wherein said support member is made of plastically deformable material so that said pair of upright walls of the support member can be bent inward with respect to each other to encircle the intermediate portion of the optical fiber and fixedly secure the same.

5. An optical semiconductor device as set forth in claim 3, wherein said support member has a substantially U-shaped groove so that the intermediate portion of the optical fiber can be inserted into said substantially U-shaped groove and fixedly positioned with respect to said stage.

6. An optical semiconductor device as set forth in claim 3, wherein said support member has a substantially V-shaped groove so that the intermediate portion of the optical fiber can be inserted into said substantially V-shaped groove and fixedly positioned with respect to said stage.

7. An optical semiconductor device as set forth in claim 3, wherein said intermediate portion of the optical fiber is located outside of said substrate.

8. An optical semiconductor device as set forth in claim 3, wherein said intermediate portion of the optical fiber is fixedly secured to said support member by means of adhesive.

9. An optical semiconductor device as set forth in claim 3, wherein said support member is made of a plastically deformable material and has a bottom portion and a pair of upright walls extending upward from respective sides of said bottom portion, and said pair of upright walls of the support member are bent inward with respect to each other to encircle the intermediate portion of the optical fiber so that said intermediate portion is fixedly secured to said support member.

10. An optical semiconductor device as set forth in claim 3, wherein said insulating sealing means is a mold resin.

11. A lead frame for mounting thereon an optical semiconductor device, said lead frame comprising:

a stage on which a substrate is to be mounted, said substrate being used for mounting thereon an optical semiconductor chip and a leading end of an optical fiber;

a plurality of leads arranged in a peripheral region of said stage;

a support member extended from said stage, said support member being used for fixedly positioning an intermediate portion of the optical fiber with respect to said stage;

said support member having a bottom portion and a pair of upright walls extending upward from respective sides of said bottom portion; and said stage, said plurality of leads and said bottom portion of the support member being formed on a common surface.

12. A lead frame as set forth in claim 11, wherein said stage and said support member are integrally made of a metal plate.

* * * * *